(12) United States Patent
Orishimo

(10) Patent No.: US 7,626,679 B2
(45) Date of Patent: Dec. 1, 2009

(54) EXPOSURE APPARATUS, MANUFACTURING SYSTEM, AND DEVICE MANUFACTURING METHOD

(75) Inventor: Yosuke Orishimo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/034,720

(22) Filed: Feb. 21, 2008

(65) Prior Publication Data

US 2008/0204691 A1    Aug. 28, 2008

(30) Foreign Application Priority Data

Feb. 22, 2007    (JP) ............................. 2007-042678

(51) Int. Cl.
G03B 27/32    (2006.01)
G03B 27/42    (2006.01)

(52) U.S. Cl. .......................... 355/27; 355/53
(58) Field of Classification Search .................. 355/27, 355/53, 52, 55, 69; 396/611
See application file for complete search history.

(56) References Cited

U.S. PATENT DOCUMENTS 6,607,863 B2 * 8/2003 Irie .............................. 430/30

2007/0128529 A1 * 6/2007 Kazaana ........................ 430/30

FOREIGN PATENT DOCUMENTS

| JP | 10-261572 A | 9/1998 |
|---|---|---|
| JP | 2005-322930 A | 11/2005 |
| JP | 2007-019370 A | 1/2007 |

OTHER PUBLICATIONS

Japanese Office Action issued on Jan. 5, 2009 for the Japanese Patent Application No. 2007-042678 and not previously cited in a different Office Action (No English translation provided).

* cited by examiner

*Primary Examiner*—Hung Henry Nguyen
(74) *Attorney, Agent, or Firm*—Canon U.S.A., Inc., IP Division

(57) ABSTRACT

An exposure apparatus of the present invention includes: an exposure unit configured to expose photoresist coated on a substrate to light to transfer a pattern of a mask to the photoresist with respect to each of shot regions; and a controller configured to obtain a dose of light for each of the shot regions based on a lithography schedule for each of the shot regions, and to cause the exposure unit to expose each of the shot regions to light in accordance with the obtained dose of light.

5 Claims, 12 Drawing Sheets

FIG. 4

WaferID : 0033 ← 301a

| SHOT ID | ESTIMATED SHOT EXPOSURE START TIME | REMAINING SUBSTRATE EXPOSURE TIME |
|---|---|---|
| SH2 | 00:10:00 | 30.00 |

301b     301c     301d

301

EXPOSURE APPARATUS, MANUFACTURING SYSTEM, AND DEVICE MANUFACTURING METHOD

BACKGROUND OF THE INVENTION

1. Field of the Invention

The present invention relates to an exposure apparatus, a manufacturing system, and a device manufacturing method.

2. Description of the Related Art

In the lithography process for manufacturing devices such as semiconductor devices, a photoresist, for example, is applied on the surface of a substrate and the photoresist is exposed to light to transfer patterns from a mask to the photoresist using light and electronic beams. The photoresist on which the patterns have been transferred is developed to form patterns on an oxide film, nitride film, or metal film on the substrate. In the process, a coater is used for applying the photoresist, an exposure apparatus is used for exposing the photoresist, and a developer is used for developing the photoresist. The exposure apparatus performs the exposure process on the substrate divided into areas of a certain size by, for example, step-and-repeat or step-and-scan exposure. Each of the divided areas is subjected to one exposure step or one exposure scan and is called a shot region.

In order to ensure that the line width of the circuit pattern ultimately formed on the substrate falls within a predetermined tolerance with respect to a design value, the line width of the resist pattern resulting from the lithography process must be within a predetermined tolerance. One factor that influences the line width of a resist pattern is the dose of light with which the photoresist is irradiated.

In order to provide a resist pattern having a desired line width, the resist pattern must be exposed with an appropriate dose of light. The appropriate dose of light depends on the sensitivity of the photoresist. The sensitivity of a photoresist varies depending on the waiting time between the application of the photoresist onto the substrate and the exposure of the photoresist (pre-exposure waiting time). The sensitivity of the photoresist also varies depending on the waiting time between the exposure of the photoresist on the substrate and the development of the photoresist (post-exposure waiting time).

In the conventional lithography process, variations in the pre-exposure waiting time and post-exposure waiting time have caused variations in resolution line width.

In a technique disclosed in Japanese Patent Laid-Open No. 10-261572, the dose of light is calculated by taking into account the time between the application of a photoresist onto a substrate and the start of the exposure of the substrate and the calculated dose of light is used to perform the exposure. In the technique disclosed in Japanese Patent Laid-Open No. 10-261572, the time between the start of exposure of the substrate and the development of the substrate is also taken into account to calculate the dose of light, and the calculated dose of light is used to perform the exposure.

Also in the technique disclosed in Japanese Patent Laid-Open No. 10-261572, the time between the application of a photoresist onto the substrate and the start of exposure of the substrate is used as the pre-exposure waiting time for the substrate for calculating the dose of light. In the technique disclosed in Japanese Patent Laid-Open No. 10-261572, the time between the start of exposure of the substrate and the development of the substrate is used as the post-exposure waiting time for the substrate for calculating the dose of light. That is, the same dose of light is used for multiple shot regions on one substrate.

However, pre-exposure waiting time and post-exposure waiting time vary among the multiple shot regions on one substrate. Accordingly, using the same dose of light for the multiple shot regions can cause variations in the line width of a resist pattern formed by the exposure and the development on the substrate among shot regions.

SUMMARY OF THE INVENTION

The present invention provides for reducing variations in the line width of a resist pattern among shot regions.

An exposure apparatus according to a first aspect of the present invention includes: an exposure unit configured to expose photoresist coated on a substrate to light to transfer a pattern of a mask to the photoresist with respect to each of shot regions; and a controller configured to obtain a dose of light for each of the shot regions based on a lithography schedule for each of the shot regions, and to cause the exposure unit to expose each of the shot regions to light in accordance with the obtained dose of light.

A manufacturing system according to a second aspect of the present invention includes: an exposure apparatus according to a first aspect of the present invention for exposing photoresist coated on a substrate to light; and at least one of a coating apparatus for coating a substrate with photoresist and a development apparatus for developing a substrate coated with photoresist exposed to light by the exposure apparatus.

A method of manufacturing a device according to a third aspect of the present invention includes steps of: coating a substrate with photoresist; exposing the photoresist coated on the substrate to light by using an exposure apparatus according to a first aspect of the present invention; and developing the exposed photoresist on the substrate to manufacture the device.

According to the present invention, variations in the line width of a resist pattern among shot regions can be reduced.

Further features of the present invention will become apparent from the following description of exemplary embodiments with reference to the attached drawings.

BRIEF DESCRIPTION OF THE DRAWINGS

FIG. 4 is a diagram showing a configuration of exposure timing information;

DESCRIPTION OF THE EMBODIMENTS

Figure 1:
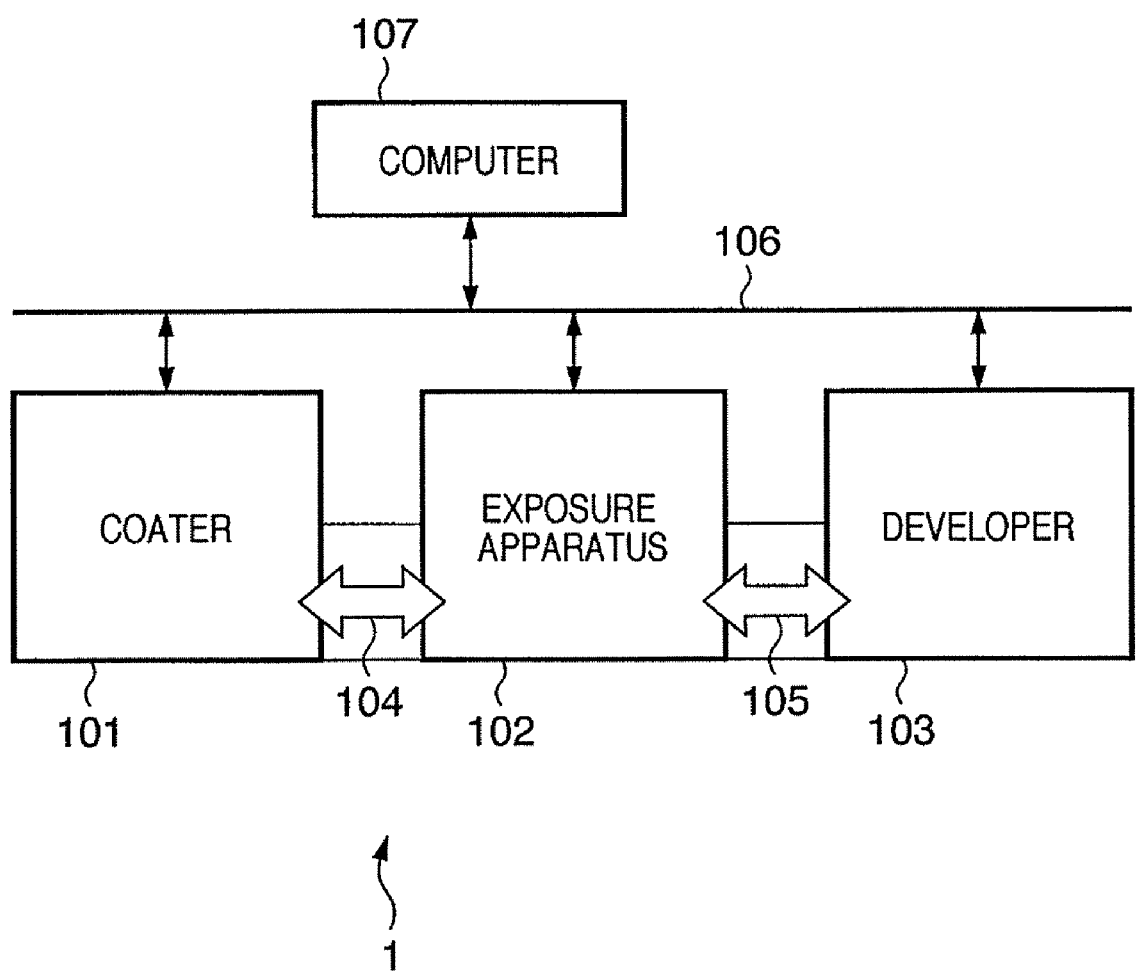
FIG. 1 is a block diagram showing a configuration of a semiconductor manufacturing system 1 according to an embodiment of the present invention.

A general configuration and operation of a semiconductor manufacturing system 1 according to an embodiment of the present invention will be described with reference to FIG. 1. FIG. 1 shows a configuration of a semiconductor manufacturing system 1 according to an embodiment of the present invention.

Referring to FIG. 1, the semiconductor manufacturing system 1 includes a coater (coating apparatus) 101, an exposure apparatus 102, a developer (development apparatus) 103, substrate carrying lines 104 and 105, a network 106, and a computer 107.

The coater 101, the exposure apparatus 102, the developer 103, and the computer 107 are interconnected via the network 106. Thus, the coater 101, the exposure apparatus 102, the developer 103, and the computer 107 are capable of transmitting and receiving information to and from each other.

For example, the coater 101, the exposure apparatus 102, and the developer 103 transmit information such as process timings to the computer 107 via the network 106. Thus, the computer 107 can monitor (manage) timings at which the coater 101, the exposure apparatus 102, and the developer 103 performed their processes.

Also, the coater 101, the exposure apparatus 102, and the developer 103 receive information such as process instructions from the computer 107 via the network 106. Thus, the computer 107 can control (manage) the coater 101, the exposure apparatus 102, and the developer 103 via the network 106.

A substrate is loaded into the coater 101. The substrate may be a wafer, for example. The coater 101 applies a photoresist (photosensitive material) onto the substrate. Here, the coater 101 applies the photoresist onto multiple shot regions at substantially the same time.

The substrate carrying a line 104 connects the coater 101 to the exposure apparatus 102 in such a manner that a substrate can be carried. The substrate carrying the line 104 carries the substrate coated with a photoresist by the coater 101 from the coater 101 to the exposure apparatus 102.

The exposure apparatus 102 exposes a photoresist applied on a substrate to light to imprint (transfer) a pattern from a mask onto the photoresist. The mask may be a reticle. Here, the exposure apparatus 102 transfers the pattern from the mask to multiple shot regions in sequence.

The substrate carrying line 105 connects the exposure apparatus 102 to the developer 103 in such a manner that a substrate can be carried. Thus, the substrate carrying line 105 carries the photoresist and substrate exposed by the exposure apparatus 102 from the exposure apparatus 102 to the developer 103.

The developer 103 develops an exposed photoresist. Here, the developer 103 exposes the photoresist in multiple shot regions at substantially the same time.

Figure 2:
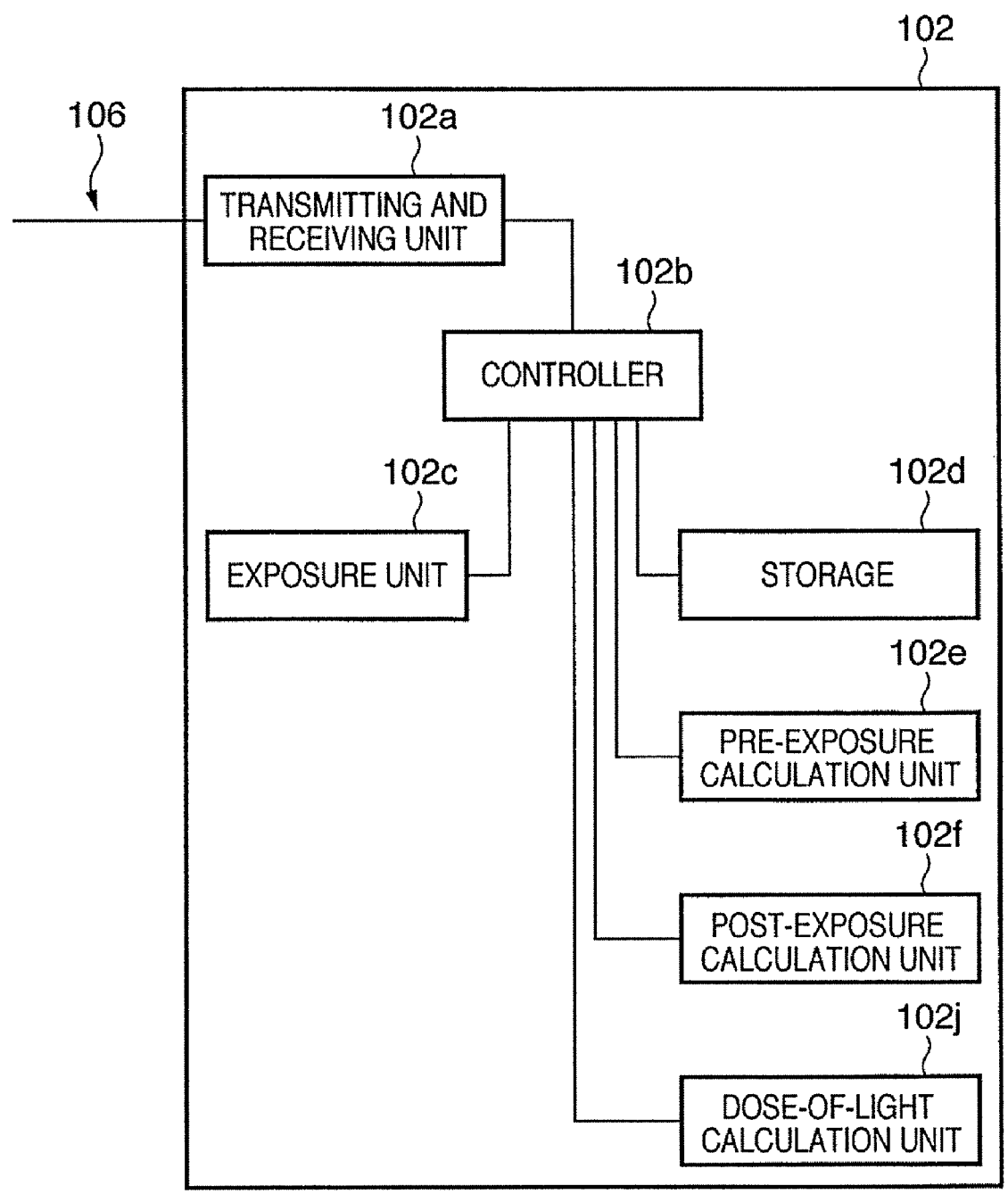
FIG. 2 is a block diagram showing a configuration of an exposure apparatus.
Figure 3:
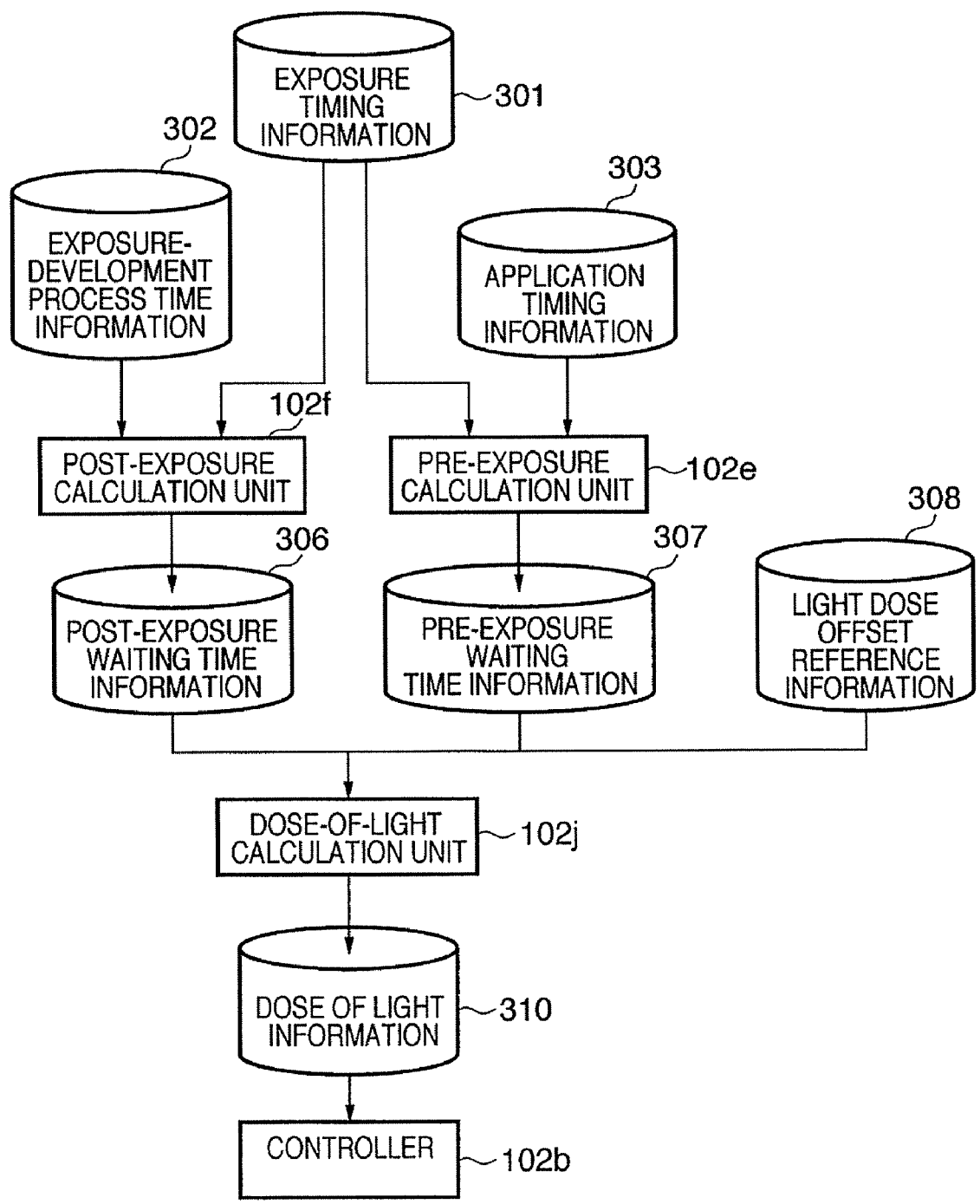
FIG. 3 is a dataflow diagram illustrating an operation of the exposure apparatus.

A configuration and operation of the exposure apparatus 102 will be described below with reference to FIGS. 2 and 3. FIG. 2 is a block diagram showing a configuration of the exposure apparatus 102. FIG. 3 is a dataflow diagram illustrating an operation of the exposure apparatus 102.

Referring to FIG. 2, the exposure apparatus 102 includes a transmitting and receiving unit 102a, a controller 102b, an exposure unit 102c, a storage 102d, a pre-exposure calculation unit 102e, a post-exposure calculation unit 102f, and a dose-of-light calculation unit 102j.

The transmitting and receiving unit 102a is connected to the network 106 (see FIG. 1) and the controller 102b. The controller 102b is connected with the transmitting and receiving unit 102a, the exposure unit 102c, the storage 102d, the pre-exposure calculation unit 102e, the post-exposure calculation unit 102f, and the dose-of-light calculation unit 102j.

The transmitting and receiving unit 102a receives exposure instruction information from the computer 107 via the network 106 and provides the information to the controller 102b. The controller 102b generates exposure timing information (lithography schedule, second information) based on the exposure instruction information. The exposure timing information is information concerning the exposure timing for each shot region. The exposure timing is a scheduled timing at which each shot region on a photoresist is to be exposed.

For example, exposure timing information 301 includes substrate identification information 301a, shot region identification information 301b, estimated shot region exposure start timing information 301c, and remaining substrate exposure time information 301d, as shown in FIG. 4.

The substrate identification information 301a identifies a substrate to be exposed and may be a wafer ID, for example "0033". The controller 102b may acquire substrate identification information included in exposure instruction information, for example, as the substrate identification information 301a. Alternatively, the controller 102b may acquire the substrate identification information 301a by causing a reader (not shown, for example a CCD) to read substrate identification information inscribed in a substrate.

The shot region identification information 301b identifies a shot region to be exposed and indicates the order in which shot regions are to be exposed on the substrate. For example, the shot region identification information 301b may be a shot region ID, "SH2". The controller 102b counts shot regions to identify the number in an order of a shot region that will be or has been exposed, immediately before or after the start of exposure. The controller 102b generates shot region identification information 301b according to the count.

The estimated shot region exposure start timing information 301c indicates a scheduled timing at which exposure of a shot region to be exposed is to be started. For example, the controller 102b generates estimated shot region exposure start timing information for a shot region to be exposed based on the exposure start timing and exposure time for the shot region preceding a current shot region to be exposed.

The controller 102b calculates the exposure time ΔT1 for the shot region preceding a current shot region to be exposed from the dose of light D1 of the shot region preceding the current shot region to be exposed by $$\Delta T1 = K * D1 \qquad \text{Equation 1}$$

where K is a factor for converting a dose of light to an exposure time.

Figure 8:
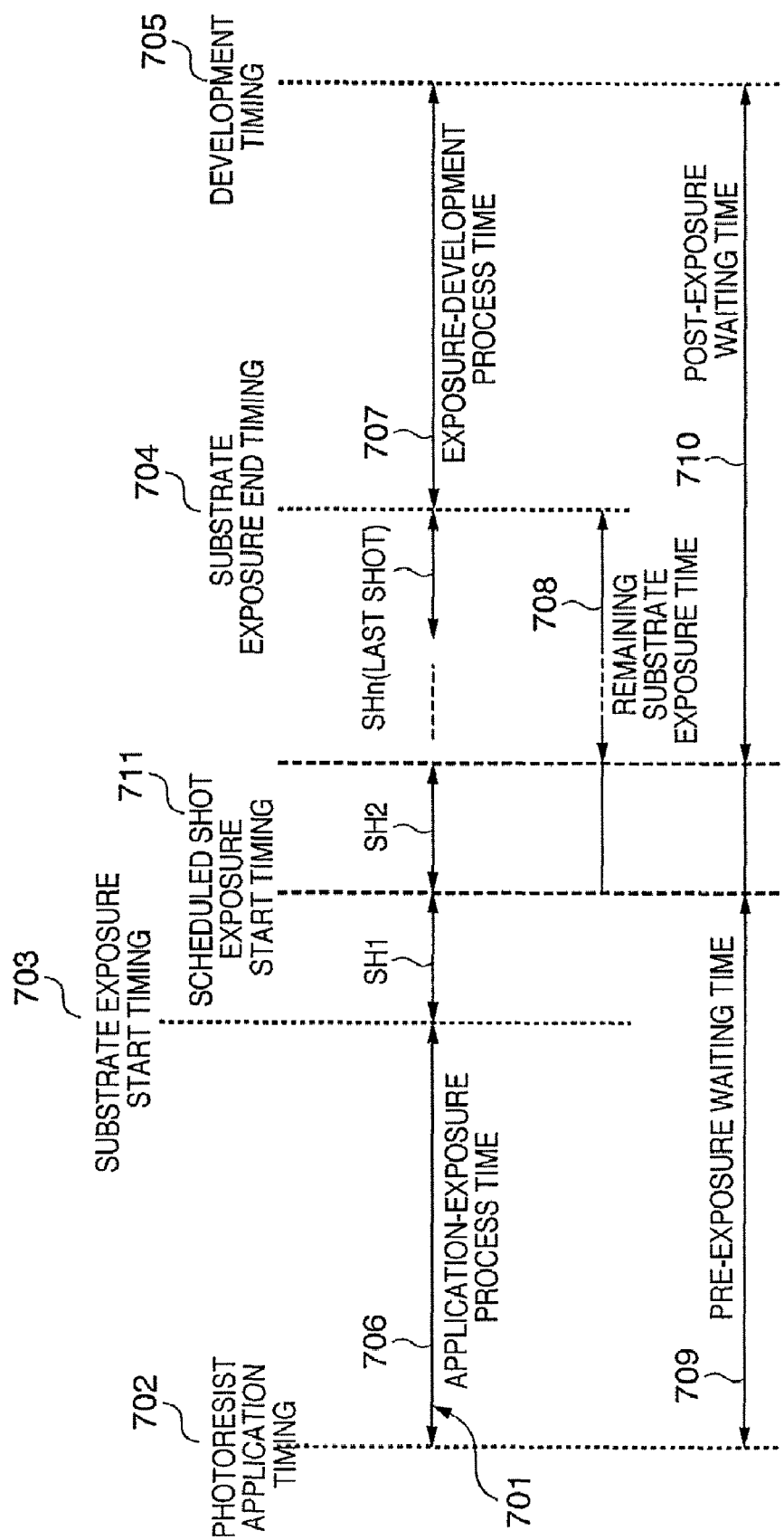
FIG. 8 is a diagram showing timings of processes performed on a coater, the exposure apparatus, and a developer and time relationship between the processes.

The remaining substrate exposure time information 301d indicates an estimated time between the start of exposure of a shot region to be exposed and the end of exposure of the last shot region (see remaining substrate exposure time 708 shown in FIG. 8). For example, the controller 102b acquires the number n of all the shot regions on a substrate to be exposed, information indicating that a shot region to be exposed is the i-th shot region, and statistically obtained average exposure time ΔTav per shot region. The controller 102b calculates (estimates) the remaining substrate exposure time RT from these items of information by $$RT = (n - i + 1) * \Delta Tav \qquad \text{Equation 2}$$

The controller 102b shown in FIG. 2 provides the exposure timing information 301 thus generated to the pre-exposure calculation unit 102e and the post-exposure calculation unit 102f.

Based on exposure instruction information, the controller 102b causes the transmitting and receiving unit 102a to receive application timing information (first information) 303 (see FIG. 3) from the computer 107 via the network 106. The application timing information is information concerning application timing and is a predicted time between the exposure end timing of a substrate and the development timing of the substrate, stored beforehand. The application timing is a timing at which a photoresist was applied onto a substrate. The transmitting and receiving unit 102a provides the application timing information 303 to the pre-exposure calculation unit 102e through the controller 102b.

The application timing information 303 has been transmitted beforehand from the coater 101 to the computer 107 via the network 106 after the coater 101 applied the photoresist onto the substrate.

Exposure-development process time information (second information) 302 (see FIG. 3) is stored in the storage 102d. The exposure-development process time information is history information concerning the time between the exposure end timing of the last shot region on a substrate processed in the past and the scheduled timing of development (development timing) (see exposure-development process time 707 in FIG. 8). The controller 102b retrieves the exposure-development process time information 302 from the storage 102d based on the exposure instruction information and provides it to the post-exposure calculation unit 102f.

It is assumed here that the exposure-development process time information 302 has been transmitted from the developer 103 to the computer 107 via the network 106 when the developer 103 developed a photoresist in the past, and that the exposure-development process time information 302 has been provided from the computer 107 to the storage 102d via the network 106, the transmitting and receiving unit 102a, and the controller 102b.

The pre-exposure calculation unit 102e calculates the pre-exposure waiting time for each shot region based on application timing information 303 and exposure timing information 301. The pre-exposure waiting time is the time between the application timing of a photoresist onto a substrate and the scheduled exposure timing for a shot region to be exposed. For example, the pre-exposure calculation unit 102e calculates the difference between the application timing (see photoresist application timing 702 in FIG. 8) and the scheduled exposure start timing for a shot region to be exposed (see scheduled shot region exposure start timing 711 in FIG. 8). The pre-exposure calculation unit 102e sets the difference as the pre-exposure waiting time for the shot region to be exposed. In this way, the pre-exposure calculation unit 102e generates pre-exposure waiting time information 307 and provides it to the dose-of-light calculation unit 102j through the controller 102b.

The post-exposure calculation unit 102f calculates the post-exposure waiting time for each shot region based on exposure timing information 301 and exposure-development process time information 302. The post-exposure waiting time is the time between the scheduled exposure end timing of the shot region to be exposed and the scheduled development timing of the photoresist. For example, the post-exposure calculation unit 102f calculates the sum of the remaining substrate exposure time (see remaining substrate exposure time 708 in FIG. 8) and the exposure-development process time (see exposure-development process time 707 in FIG. 8).

The post-exposure calculation unit 102f sets the sum as the post exposure waiting time for the shot region to be exposed. In this way, the post-exposure calculation unit 102f generates post-exposure waiting time information 306 and provides it to the dose-of-light calculation unit 102j through the controller 102b.

Light dose offset reference information 308 (see FIG. 5) is stored in the storage 102d in addition to the exposure-development process time information 302 described above. Upon reception of pre-exposure waiting time information 307 or post-exposure waiting time information 306, the dose-of-light calculation unit 102j refers to the storage 102d through the controller 102b to obtain a light dose offset for the shot region to be exposed.

Figure 5:
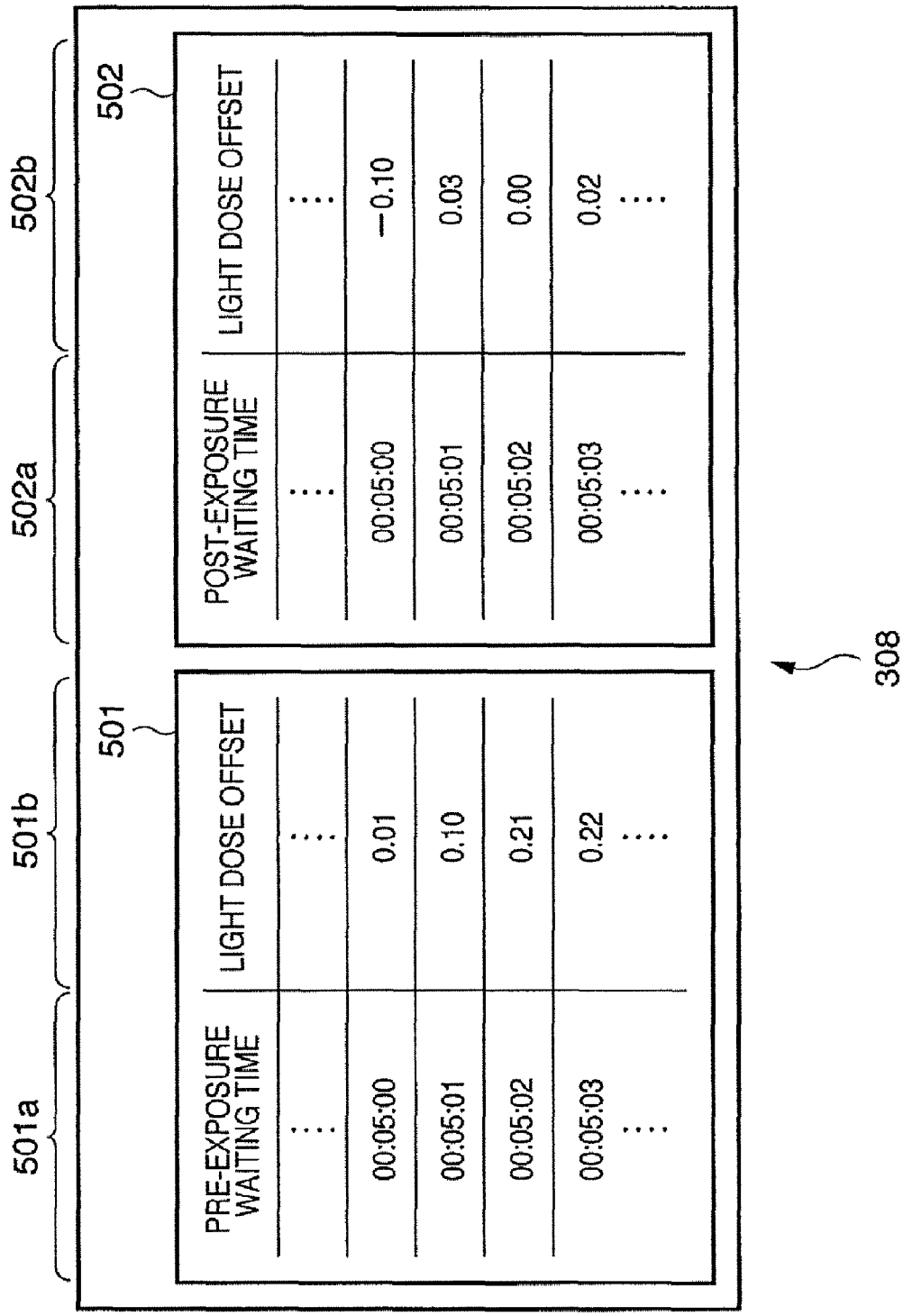
FIG. 5 is a diagram showing light dose offset reference information.

For example, the light dose offset reference information 308 includes pre-exposure offset information 501 and post-exposure offset information 502 as shown in FIG. 5.

Figure 6:
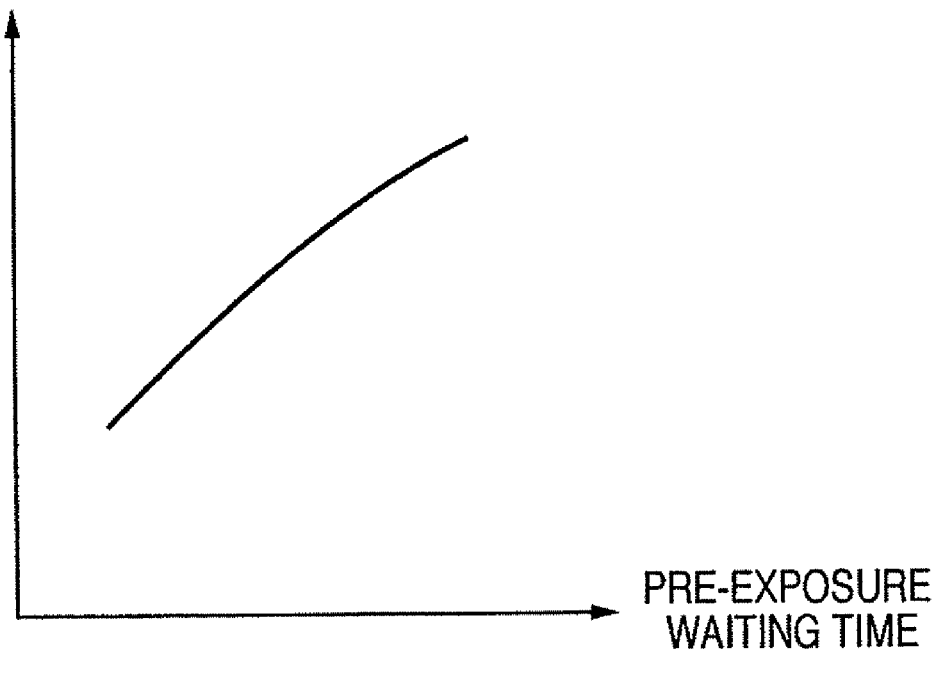
FIG. 6 is a diagram showing light dose offset reference information.

The pre-exposure offset information 501 includes a pre-exposure waiting time column 501a and a light dose offset column 501b. The pre-exposure waiting time column 501a contains the amount of waiting time before exposure. The light dose offset column 501b contains an offset value of dose of light (a value of light dose offset). Pre-exposure offset information 501 can be conceptually represented as a graph shown in FIG. 6. It can be seen from FIG. 6 that the optimum dose of light increases as the amount of pre-exposure waiting time increases. With reference to pre-exposure offset information 501 as shown in FIGS. 5 and 6, an appropriate light dose offset for pre-exposure waiting time can be obtained.

Figure 7:
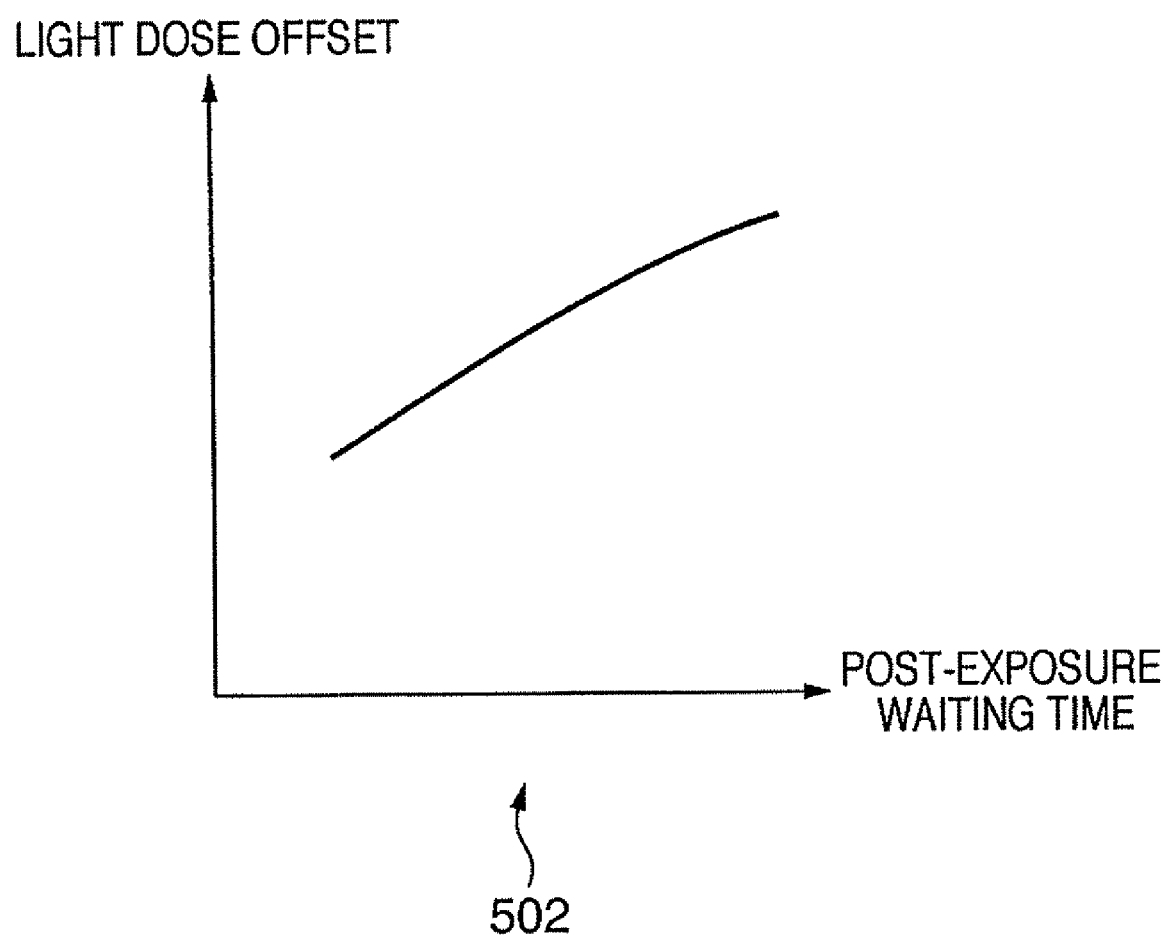
FIG. 7 is a diagram showing light dose offset reference information.

The post-exposure offset information 502 includes a post-exposure waiting time column 502a and a light dose offset column 502b. The post-exposure waiting time column 502a contains the amount of waiting time after exposure. The light dose offset column 502b contains an offset value of dose of light (a value of light dose offset). Post-exposure offset information 502 can be conceptually represented as a graph shown in FIG. 7. As can be seen from FIG. 7, the optimum dose of light increases as the amount of post-exposure waiting time increases. With reference to post-exposure offset information 502 as shown in FIGS. 5 and 7, an appropriate light dose offset for post-exposure waiting time can be obtained.

For example, the dose-of-light calculation unit 102j refers to the pre-exposure offset information 501 to obtain a light dose offset OD1 corresponding to pre-exposure waiting time information 307. Similarly, the dose-of-light calculation unit 102j refers to post-exposure offset information 502 to obtain a light dose offset OD2 corresponding to post-exposure waiting time information 306. The dose-of-light calculation unit 102j then obtains a light dose offset OD for the shot region to be exposed, by $$OD=OD1+OD2 \qquad \text{Equation 3}$$

The dose-of-light calculation unit 102j uses a reference dose of light BD to calculate the dose of light D2 for the shot region to be exposed by $$D2=BD+OD=BD+OD1+OD2 \qquad \text{Equation 4}$$

The dose-of-light calculation unit 102j provides the dose of light information 310 thus calculated to the controller 102b.

The controller 102b exposes the shot region to be exposed according to the dose of light information 310. For example, the controller 102b calculates an exposure time ΔT2 for the shot region to be exposed as in Equation 1 by $$\Delta T2=K*D2=K(BD+OD1+OD2) \qquad \text{Equation 5}$$

Thus the controller 102b controls the exposure unit 102c so that the shot region to be exposed is exposed over the exposure time of ΔT2 from the timing indicated by estimated shot exposure start timing information 301c.

It should be noted that the light dose offset reference information 308 depends on the material of a photoresist and the environment of an application, exposure and development, and that its measurement data is obtained beforehand and registered in the storage 102d. The light dose offset reference information 308 may be registered manually, or obtained by using data stored by the exposure unit 102c when the exposure unit 102c exposed a sample substrate. Alternatively, light dose offset for the post-exposure waiting time (see the light dose offset column 502b in FIG. 5) may be fed back by measuring the line width of the previous substrate that was exposed and developed before a substrate to be exposed, by using an SEM, and analyzing the relationship between the post-exposure waiting time and its optimum light dose offset.

It should be also noted that the light dose offset reference information 308 may include multiple items or a single item of reference information. If the light dose offset reference information 308 includes multiple items of reference information, one of the multiple items of reference information may be set according to a user input. Alternatively, one of the multiple items of reference information may be set by means of indicating, by the coater 101 or the developer 103, the setting information to the computer 107 beforehand.

The scheduled shot region exposure start timing 711 may be timing estimated by the exposure apparatus 102 by taking account of time required for calculating a light dose offset, time required for moving and accelerating the stage for exposure before the start of exposure.

FIG. 8 is a diagram showing timings of processes performed in the coater 101, the exposure apparatus 102, and the developer 103 and time relationship between the processes.

Reference numeral 701 denotes the time axis representing the passage of time in which one substrate is processed, in left-to-right order.

Reference numeral 702 denotes a photoresist application timing. The photoresist application timing is the timing at which the coater 101 applies a photoresist.

Reference numeral 703 denotes the timing at which exposure of a substrate starts, that is, the timing at which exposure of the first shot region starts.

Reference numeral 704 denotes the timing at which exposure of the substrate to be exposed ends, that is, the timing at which exposure of the last shot region ends.

Reference numeral 711 denotes scheduled shot region exposure start timing at which exposure of a shot region to be exposed on the substrate is started. In FIG. 8, the scheduled shot region exposure start timing for the second shot region SH2 is shown as an example.

During the time between the substrate exposure start timing 703 and the substrate exposure end timing 704 for one substrate, n shot regions are exposed. The substrate exposure start timing 703 is the timing at which exposure of the first shot region SH1 start. The substrate exposure end timing 704 is the timing at which exposure of the n-th shot region SHn (the last shot region) ends.

Reference numeral 705 denotes a development timing. The development timing is a scheduled timing at which development of the substrate starts.

It should be noted that the development timing may be timing at which exposure of the substrate ends or a certain timing during exposure of the substrate.

Reference numeral 706 denotes an application-exposure process time, which is the time between photoresist application timing 702 and substrate exposure start timing 703.

Reference numeral 707 denotes exposure-development process time, which is the time between the substrate exposure end timing 704 and the development timing 705.

Reference numeral 708 represents the time between the timing at which exposure of a shot region to be exposed ends and the substrate exposure end timing 704. In FIG. 8, the time between exposure end timing of the second shot region SH2 and substrate exposure end timing 704 is shown as an example.

Reference numeral 709 denotes a pre-exposure waiting time, which represents the time between the photoresist application timing 702 and the scheduled shot region exposure start timing 711 for a shot region to be exposed.

Reference numeral 710 denotes a post-exposure waiting time, which represents the time between the timing at which exposure of a shot region to be exposed ends and the development timing 705.

As has been described, according to the present invention, the dose of light can be adjusted appropriately for each individual shot region by taking account of the pre-exposure substrate waiting time for the shot region to be exposed and post-exposure waiting time for the shot region to be exposed. Thus, variations among shot regions in the line width of a resist pattern formed on the substrate by exposure and development can be reduced.

It should be noted that the computer 107 in the semiconductor manufacturing system 1 may be part of at least one of the coater 101, the exposure apparatus 102, and the developer 103. The coater 101 and the developer 103 in the semiconductor manufacturing system 1 may be incorporated in the same apparatus.

It should be also noted that the storage 102d, the pre-exposure calculation unit 102e, the post-exposure calculation unit 102f, and the dose-of-light calculation unit 102j may be included in the computer 107, instead of being included in the exposure apparatus 102. In that case, the process shown in FIG. 3 is performed on the computer 107, and the computer 107 transmits information concerning the controlled variable of the exposure unit 102c to the exposure apparatus 102 via the network 106. The exposure unit 102c in the exposure apparatus 102 then exposes a substrate according to the information concerning the controlled variable received by the transmitting and receiving unit 102a.

Working Example 1

Figure 9:
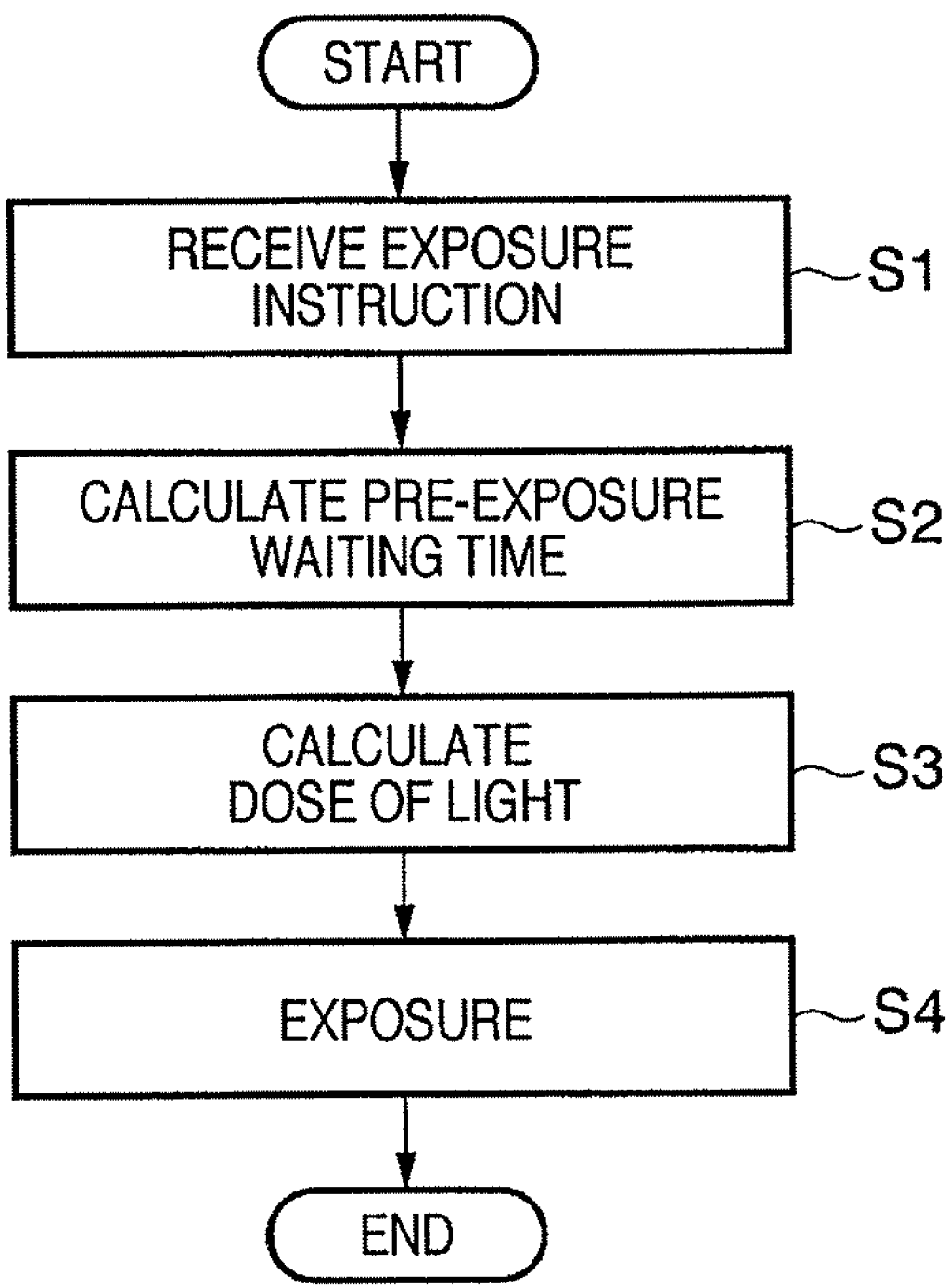
FIG. 9 is a flowchart illustrating a flow of an exposure process performed by the exposure apparatus.

An example of correction of dose of light made by taking into consideration variations in time between the application timing of a photoresist and the shot exposure timing of each shot region will be described with reference to a flowchart in FIG. 9. FIG. 9 is a flowchart illustrating a flow of process of exposure performed by the exposure apparatus 102.

In step S1, the transmitting and receiving unit 102a in the exposure apparatus 102 receives exposure instruction information from the computer 107 via the network 106 and provides the information to the controller 102b. The controller 102b generates exposure timing information based on the exposure instruction information. The controller 102b provides the exposure timing information 301 to the pre-exposure calculation unit 102e.

Based on the exposure instruction information, the controller 102b causes the transmitting and receiving unit 102a to receive application timing information 303 (see FIG. 3) from the coater 101 via the network 106. The transmitting and receiving unit 102a provides the application timing information 303 to the pre-exposure calculation unit 102e through the controller 102b.

In step S2, the pre-exposure calculation unit 102e calculates pre-exposure waiting time for each shot region based on the application timing information 303 and the exposure timing information 301. For example, the pre-exposure calculation unit 102e calculates the difference between the application timing (see photoresist application timing 702 in FIG. 8) and the scheduled shot exposure start timing for a shot region to be exposed (see scheduled shot exposure start timing 711 in FIG. 8). The pre-exposure calculation unit 102e sets the difference as pre-exposure waiting time for the shot region to be exposed. The pre-exposure calculation unit 102e thus generates pre-exposure waiting time information 307 and provides the pre-exposure waiting time information 307 to the dose-of-light calculation unit 102j through the controller 102b.

In step S3, upon receiving the pre-exposure waiting time information 307, the dose-of-light calculation unit 102j refers to pre-exposure offset information 501 (see FIG. 5) in the storage 102d through the controller 102b to obtain a light dose offset for the shot region to be exposed.

For example, if the dose-of-light calculation unit 102j determines that pre-exposure waiting time indicated by the pre-exposure waiting time information 307 is "00:05:00", the dose-of-light calculation unit 102j obtains a light dose offset of "0.01" by using the pre-exposure offset information 501 (see FIG. 5). The dose-of-light calculation unit 102j then calculates a dose of light D3 for the shot region to be exposed as in Equations 3 and 4 by $$D3 = BD + 0.01 \quad \text{Equation 6}$$

The dose-of-light calculation unit 102j provides the calculated dose of light information 310 to the controller 102b.

In step S4, the controller 102b controls the exposure unit 102c for the shot region to be exposed according to the dose of light information 310. For example, the controller 102b calculates an exposure time $\Delta T3$ for the shot region to be exposed as in Equation 1 by $$\Delta T3 = K^*D3 = K(BD + 0.01) \quad \text{Equation 7}$$

Thus, the controller 102b controls the exposure unit 102c so that the shot region to be exposed is exposed over the exposure time $\Delta T3$ from the timing indicated by estimated shot exposure start timing information 301c.

Working Example 2

Figure 10:
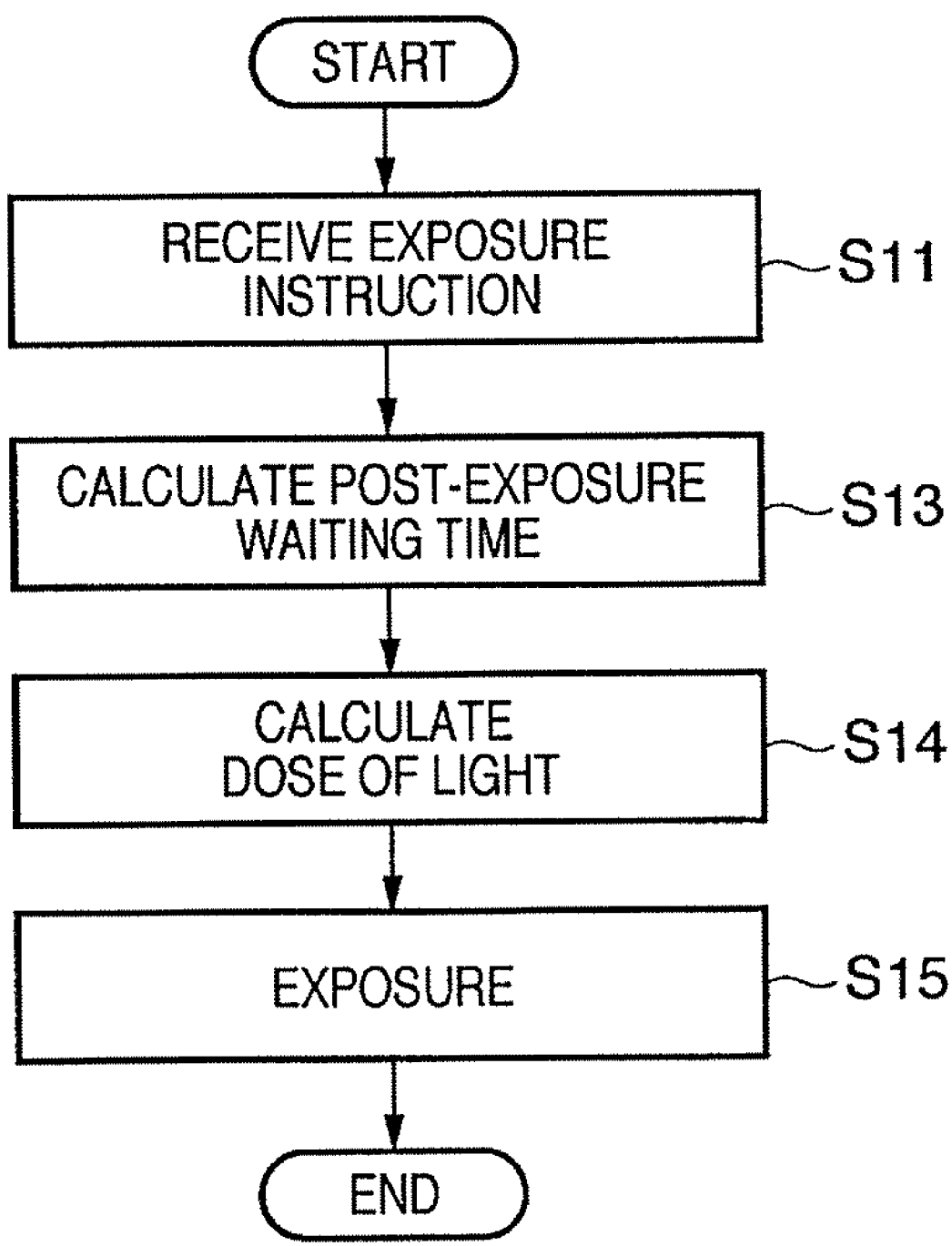
FIG. 10 is a flowchart illustrating a flow of an exposure process performed by the exposure apparatus.

An example of correction of dose of light made by taking into consideration variations in time between the shot exposure end timing of each shot region and the development timing of a photoresist will be described with reference to a flowchart in FIG. 10. FIG. 10 is a flowchart illustrating a flow of process of exposure performed by the exposure apparatus 102.

In step S11, the transmitting and receiving unit 102a in the exposure apparatus 102 receives exposure instruction information from the computer 107 via the network 106 and provides the information to the controller 102b. The controller 102b generates exposure timing information based on the exposure instruction information. The controller 102b provides the exposure timing information 301 to the pre-exposure calculation unit 102e.

Based on the exposure instruction information, the controller 102b retrieves exposure-development process time information 302 from the storage 102d and provides it to the post-exposure calculation unit 102f.

In step S13, the post-exposure calculation unit 102f calculates post-exposure waiting time for each shot region based on the exposure-development process time information 302 and exposure timing information 301. For example, the post-exposure calculation unit 102f calculates the sum of the remaining substrate exposure time (see remaining substrate exposure time 708 in FIG. 8) and the exposure-development process time (see exposure-development process time 707 in FIG. 8). The post-exposure calculation unit 102f sets the sum as the post-exposure waiting time for the shot region to be exposed. The post-exposure calculation unit 102f thus generates post-exposure waiting time information 306 and provides it to the dose-of-light calculation unit 102j through the controller 102b.

In step S14, upon receiving the post-exposure waiting time information 306, the dose-of-light calculation unit 102j refers to post-exposure offset information 502 (see FIG. 5) of the storage 102d through the controller 102b to obtain a light dose offset for the shot region to be exposed.

For example, if the dose-of-light calculation unit 102j determines that the post-exposure waiting time indicated by the post-exposure waiting time information 306 is "00:50:00", the dose-of-light calculation unit 102j obtains a light dose offset of "−0.10" by using the post-exposure offset information 502 (see FIG. 5). The dose-of-light calculation unit 102j then calculates a dose of light D4 for the shot region to be exposed as in Equations 3 and 4 by $$D4 = BD - 0.10 \quad \text{Equation 8}$$

The dose-of-light calculation unit 102j provides the calculated dose of light information 310 to the controller 102b.

In step S15, the controller 102b controls the exposure unit 102c for the shot region to be exposed according to the dose of light information 310. For example, the controller 102b calculates exposure time $\Delta T4$ for the shot region to be exposed as in Equation 1 by $$\Delta T4 = K^*D4 = (BD - 0.10) \quad \text{Equation 9}$$

Thus, the controller 102b controls the exposure unit 102c so that the shot region to be exposed is exposed over the exposure time $\Delta T4$ from a timing indicated by estimated shot exposure start timing information 301c.

Working Example 3

Figure 11:
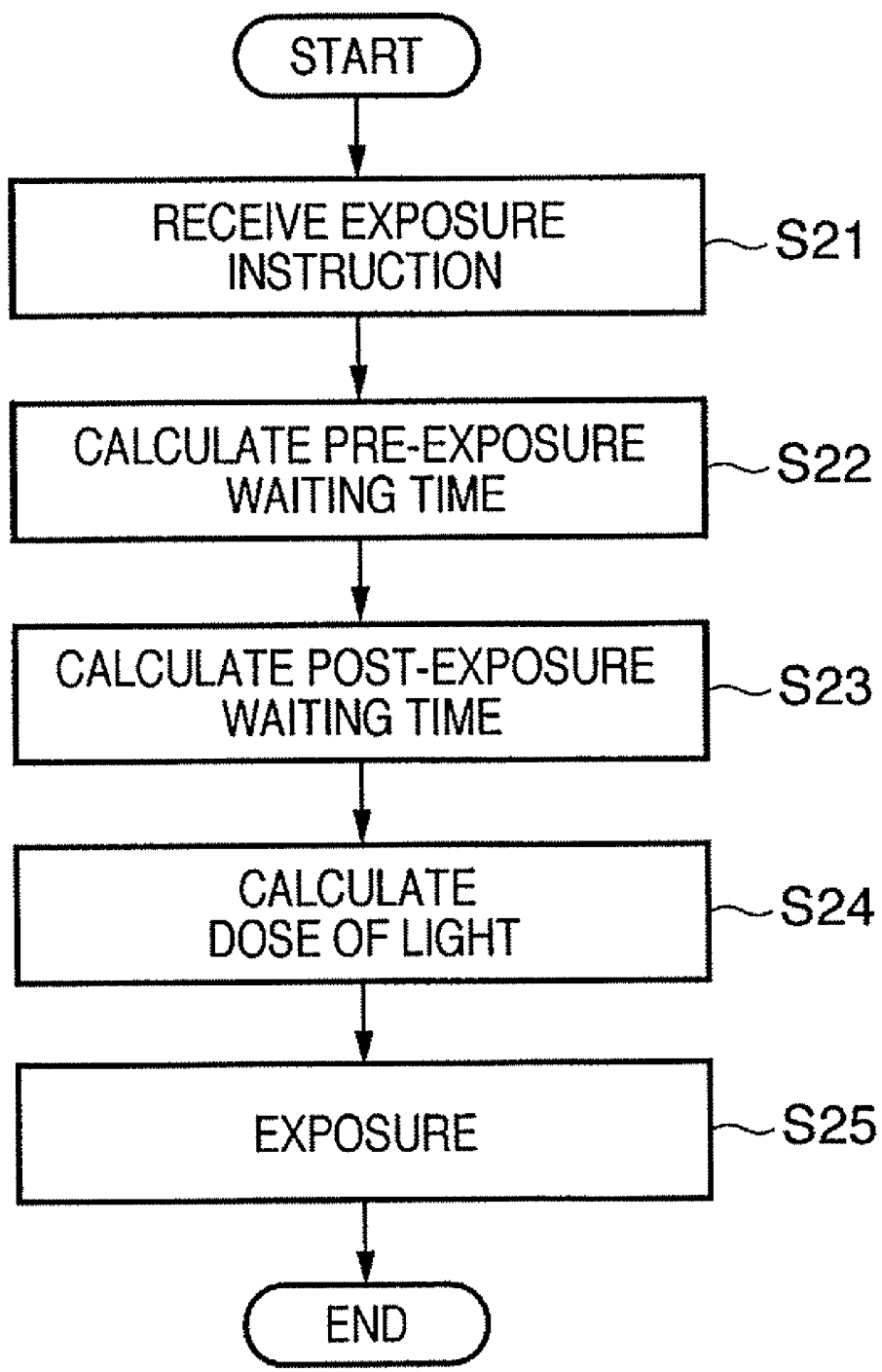
FIG. 11 is a flowchart illustrating a flow of an exposure process performed by the exposure apparatus.

An example of correction of dose of light made by taking into consideration variations in time between the application timing of a photoresist and the shot exposure end timing of each shot region and variations in time between the shot exposure end timing of each shot region and the development timing of the photoresist will be described with reference to a flowchart in FIG. 11. FIG. 11 is a flowchart illustrating a flow of process of exposure performed by the exposure apparatus 102.

In step S21, the transmitting and receiving unit 102a in the exposure apparatus 102 receives exposure instruction information from the computer 107 via the network 106 and provides the information to the controller 102b. The controller 102b generates exposure timing information based on the exposure instruction information. The controller 102b provides the exposure timing information 301 to the pre-exposure calculation unit 102e.

Based on the exposure instruction information, the controller 102b causes the transmitting and receiving unit 102a to receive application timing information 303 (see FIG. 3) from the coater 101 via the network 106. The transmitting and receiving unit 102a provides the application timing information 303 to the pre-exposure calculation unit 102e through the controller 102b.

The controller 102b also retrieves exposure-development process time information 302 from the storage 102d based on the exposure instruction information and provides it to the post-exposure calculation unit 102f.

In step S22, the pre-exposure calculation unit 102e calculates pre-exposure waiting time for each shot region based on the application timing information 303 and exposure timing information 301. For example, the pre-exposure calculation unit 102e calculates the difference between the application timing (see photoresist application timing 702 in FIG. 8) and the scheduled shot exposure start timing for the shot region to be exposed (see scheduled shot exposure start timing 711 in FIG. 8). The pre-exposure calculation unit 102e sets the difference as pre-exposure waiting time for the shot region to be exposed. The pre-exposure calculation unit 102e thus generates pre-exposure waiting time information 307 and provides it to the dose-of-light calculation unit 102j through the controller 102b.

In step S23, the post-exposure calculation unit 102f calculates a post-exposure waiting time for each shot region based on exposure-development process time information 302 and the exposure timing information 301. For example, the post-exposure calculation unit 102f calculates the sum of the remaining substrate exposure time (see remaining substrate exposure time 708 in FIG. 8) and the exposure-development process time (see exposure-development process time 707 in FIG. 8). The post-exposure calculation unit 102f sets the sum as the post-exposure waiting time for the shot region to be exposed. The post-exposure calculation unit 102f thus generates post-exposure waiting time information 306 and provides it to the dose-of-light calculation unit 102j through the controller 102b.

In step S24, upon reception of the pre-exposure waiting time information 307 and the post-exposure waiting time information 306, the dose-of-light calculation unit 102j refers to pre-exposure offset information 501 and post-exposure offset information 502 in the storage 102d through the controller 102b (see FIG. 5). Thus, the dose-of-light calculation unit 102j obtains light dose offsets (pre-exposure offset and post-exposure offset) for the shot region to be exposed.

For example, if the dose-of-light calculation unit 102j determines that the pre-exposure waiting time indicated by the pre-exposure waiting time information 307 is "00:05:00", the dose-of-light calculation unit 102j obtains a light dose offset of "0.01" by using the pre-exposure offset information 501. If the dose-of-light calculation unit 102j determines that post-exposure waiting time indicated by the post-exposure waiting time information 306 is "00:05:00", the dose-of-light calculation unit 102j obtains a light dose offset of "−0.10" by using the post-exposure offset information 502. The dose-of-light calculation unit 102j then calculates a dose of light D5 for the shot region to be exposed as in Equations 3 and 4 by $$D5=BD+0.01-0.10=BD-0.09 \quad \text{Equation 10}$$

The dose-of-light calculation unit 102j provides the calculated dose of light information 310 to the controller 102b.

In step S25, the controller 102b controls the exposure unit 102c for the shot region to be exposed based on the dose of light information 310. For example, the controller 102b calculates an exposure time $\Delta T5$ for the shot region to be exposed as in Equation 1 by $$\Delta T5=K*D5=K(BD-0.09) \quad \text{Equation 11}$$

Thus, the controller 102b controls the exposure unit 102c so that the shot region to be exposed is exposed over an exposure time of $\Delta T5$ from the timing indicated by estimated shot region exposure start timing information 301c.

It should be noted that, while the light dose offset is calculated by adding the light dose offset for pre-exposure waiting time to the light dose offset for post-exposure waiting time in this working example, the light dose offset calculating method in the present invention is not limited to this.

Figure 12:
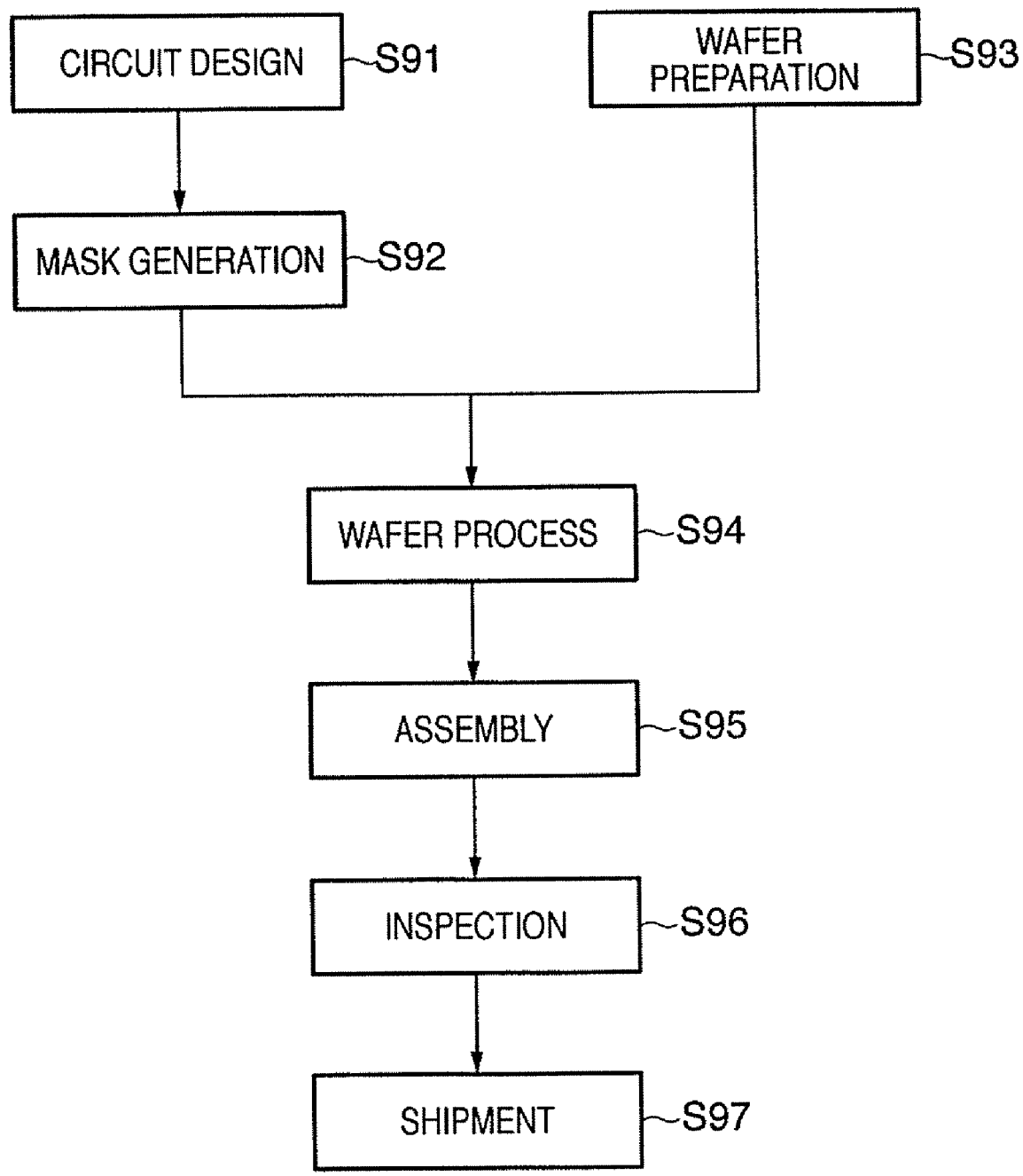
FIG. 12 is a diagram showing an overview of flow of a semiconductor device manufacturing process.

A device manufacturing process that uses an exemplary exposure apparatus of the present invention will be described with reference to FIG. 12. FIG. 12 is a flowchart illustrating an overall process for manufacturing an exemplary semiconductor device.

In step S91 (circuit design), the circuitry of the semiconductor device is designed.

In step S92 (mask generation), a mask (also called a reticle) is generated based on the designed circuit pattern.

On the other hand, a wafer (also referred to as substrate) is prepared from a material such as silicon in step S93 (wafer preparation).

In step S94 (wafer process), called the first half (front end) process, the mask and wafer are used to form actual circuits with a lithography technique on the wafer on the exposure apparatus described above.

In step S95 (assembly), called the second half (back end) process, the wafer generated at step S94 is used to make semiconductor chips. This step includes fabrication processes such as an assembly process (dicing and bonding) and a packaging process (chip packaging).

In step S96 (inspection), tests such as operation check tests and durability tests of the semiconductor devices fabricated in step S95 are performed. After undergoing these processes, the semiconductor device is completed and is then shipped in step S97 (shipment).

The wafer process in step S94 includes the following steps: an oxidation step for oxidizing the surface of the wafer; a CVD step for depositing an insulating film on the surface of the wafer; an electrode formation step for forming electrodes on the wafer by vapor deposition; and an ion implantation step for implanting ions in the wafer. The wafer process also includes: a photoresist process step for applying a photoresist onto the wafer; an exposure step for exposing the wafer onto which the photoresist was applied to light through a pattern on the mask by using the exposure apparatus described above to form a latent image pattern on the photoresist; a development step for developing the pattern image on the wafer exposed at the exposure step; an etching step for etching off the portions other than the latent pattern exposed at the exposure step; and a photoresist removal step for removing the photoresist used in the etching that is no longer needed. These steps are repeated to form layers of circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-042678, filed Feb. 22, 2007, which is hereby incorporated by reference herein in its entirety.

What is claimed is:

1. An exposure apparatus comprising:
   an exposure unit configured to expose a photoresist coated on a first substrate including a plurality of first shot regions with light for each of the first shot regions to transfer a pattern of a mask to the photoresist;

an obtaining unit configured to obtain coating timing information concerning a coating timing at which the photoresist has been coated on the first substrate;

a generation unit configured to generate shot exposure timing information concerning a scheduled timing at which each of the first shot regions is to be exposed by the exposure unit, and to generate remaining substrate exposure time information concerning a time between the scheduled timing for each of the first shot regions and a timing at which the exposure unit has completed exposure of all of the first shot regions;

a storage unit configured to store history information during a period between a timing at which a second substrate was developed and a timing at which the shot exposure timing information and the remaining substrate exposure time information of the first substrate have begun to generate, the second substrate including a plurality of second shot regions which have been processed before the first substrate, the history information concerning a time between a timing at which the exposure unit has completed exposure of all of the second shot regions and a timing at which the second substrate was developed;

a calculator configured to calculate a dose of light for each of the first shot regions by adding a first light dose offset for each of the first shot regions and a second light dose offset for each of the first shot regions to a reference dose of light, the first light dose offset being obtained according to the coating timing information and the shot exposure timing information, the second light dose offset being obtained according to the remaining substrate exposure time information and the history information; and a controller configured to cause the exposure unit to expose each of the first shot regions with light in accordance with the dose of light each of the first shot regions which is calculated by the calculator.

2. A manufacturing system comprising:

a coating apparatus for coating a substrate with a photoresist;

an exposure apparatus according to claim 1 for exposing the substrate on which the photoresist is coated with light;

a development apparatus for developing the substrate exposed with light by the exposure apparatus; and a management apparatus for managing the coating apparatus, the exposure apparatus, and the development apparatus via a network.

3. A method of manufacturing a device, the method comprising steps of:

coating a substrate with photoresist;

exposing the photoresist coated on the substrate with light by using an exposure apparatus according to claim 1; and developing the exposed photoresist on the substrate to manufacture the device.

4. An exposure apparatus according to claim 1, wherein the obtaining unit includes a transmitting and receiving unit, the transmitting and receiving unit receives, when the second substrate is developed by a development apparatus, the history information of the second substrate via a network from the development apparatus, the storage unit stores the history information of the second substrate received by the transmitting and receiving unit, and the transmitting and receiving unit receives, after receiving the history information of the second substrate, the coating timing information of the first substrate via the network from a coating apparatus.

5. An exposure apparatus according to claim 4, wherein the transmitting and receiving unit receives, after receiving the history information of the second substrate, an exposure instruction of the first substrate via the network from a management apparatus which manages the coating apparatus, the exposure apparatus, and the development apparatus via the network, the generation unit generates the shot exposure timing information and the remaining substrate exposure time information of the first substrate, according to the exposure instruction of the first substrate received by the transmitting and receiving unit.

* * * * *